(12) United States Patent
Baggenstoss

(10) Patent No.: US 7,208,813 B2
(45) Date of Patent: Apr. 24, 2007

(54) CAPACITOR LAYOUT ORIENTATION

(75) Inventor: Bill Baggenstoss, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/218,996

(22) Filed: Sep. 1, 2005

(65) Prior Publication Data

US 2006/0011992 A1   Jan. 19, 2006

Related U.S. Application Data

(62) Division of application No. 10/609,089, filed on Jun. 27, 2003.

(51) Int. Cl.
*H01L 29/00* (2006.01)

(52) U.S. Cl. ............... 257/532; 257/68; 257/71; 257/300

(58) Field of Classification Search ............... 257/396, 257/296, 68, 71, 300, 532
See application file for complete search history.

(56) References Cited

U.S. PATENT DOCUMENTS

| 5,960,464 | A  | * | 9/1999  | Lam .................... 711/206 |
| 6,020,235 | A  | * | 2/2000  | Chang .................. 438/253 |
| 6,120,952 | A  |   | 9/2000  | Pierrat et al. ............ 430/30 |
| 6,284,419 | B2 |   | 9/2001  | Pierrat et al. ............ 430/30 |
| 6,319,644 | B2 |   | 11/2001 | Pierrat et al. ............ 430/30 |
| 6,374,396 | B1 |   | 4/2002  | Baggenstoss et al. ....... 716/19 |
| 6,401,236 | B1 |   | 6/2002  | Baggenstoss et al. ....... 716/19 |
| 6,418,008 | B1 |   | 7/2002  | Jost et al. ............... 361/303 |
| 6,440,612 | B1 |   | 8/2002  | Baggenstoss ............. 430/5 |
| 6,569,574 | B2 |   | 5/2003  | Baggenstoss ............. 430/5 |

OTHER PUBLICATIONS

Murguia, James E., et al., Merging Focused Ion Beam Patterning and Optical Lithography in Device and Circuit Fabrication, Journal of Vacuum Science Technology B, Issue 8 (6), Nov./Dec. 1990, pp. 1374-1379.

Preuninger, J., et al., High Order Lens Aberration Monitor, Microelectronic Engineering 53 (2000), pp. 129-132.

* cited by examiner

*Primary Examiner*—Doug Menz
(74) *Attorney, Agent, or Firm*—Fletcher Yoder

(57) ABSTRACT

The disclosed embodiments relate to a plurality of capacitive memory elements disposed on a substrate. The substrate may comprise a processor, a memory device or other integrated circuit device. The capacitive memory elements may have a generally oblong shape and may be capacitive elements. The capacitive memory elements may be disposed in a slanted orientation. The capacitive memory elements may be disposed in a non-orthogonal orientation. The capacitive memory elements may be disposed so that an axis through one of the plurality of capacitive memory elements is not generally parallel with an edge of the substrate. The axis may not be generally perpendicular with an orthogonal edge of the substrate. The plurality of capacitive memory elements may be arranged in a first row and a second row so that an axis through one of the plurality of capacitive memory elements located in the first row does not form an axis of any capacitive memory element in the second row.

13 Claims, 3 Drawing Sheets

CAPACITOR LAYOUT ORIENTATION

CROSS-REFERENCE TO RELATED APPLICATIONS

The present application is a divisional of U.S. application Ser. No. 10/609,089, filed on Jun. 27, 2003.

BACKGROUND OF THE INVENTION

1. Field of the Invention

The present invention relates generally to the field of integrated circuit design and, more specifically, to integrated circuit memory devices.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Computer systems and other electronic devices typically include a variety of electrically interconnected integrated circuit (IC) packages which perform a variety of functions, including memory and processing functions. Many memory devices employ a circuit element known as a capacitor to store a charge corresponding to a logical voltage level. For example, an uncharged capacitor may represent a logical low and a charged capacitor may represent a logical high.

Capacitors have a property known as capacitance that relates to the ability of an individual capacitor to store a charge. The amount of charge that a capacitor is able to store is proportional to the capacitance of the capacitor. Capacitance is typically measured in farads or smaller increments, such as microfarads or picofarads. If a capacitor has a sufficiently low capacitance, it may not be able to store a charge corresponding to a logic level long enough to meet design specifications for an integrated circuit device.

The capacitance of a capacitor is proportional to the size of the capacitor. Accordingly, the ability of a capacitor to hold a charge long enough to meet design criteria for integrated circuit devices may diminish as capacitor size becomes increasingly small. This is unfortunate because small device size is generally a desirable goal of integrated circuit design. As technology advances, manufacturers of integrated circuits develop processes that allow the production of smaller and smaller integrated circuit devices. Thus, it is a desirable design goal to increase the capacitance of a capacitor while decreasing the overall physical size of the capacitor.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
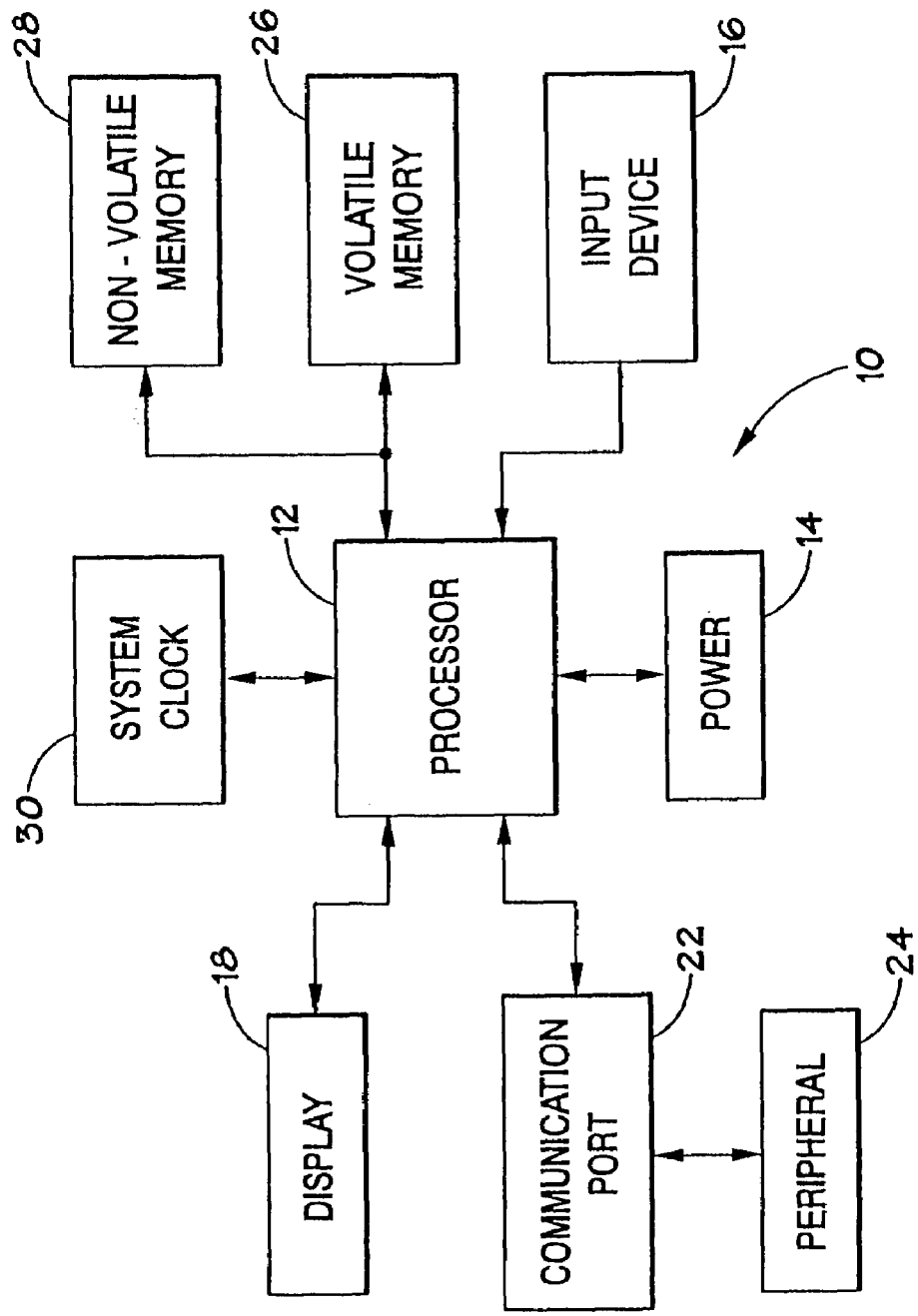
FIG. 1 is a block diagram of an electronic device containing integrated circuit devices that may employ embodiments of the present invention.

Turning now to the drawings, FIG. 1 is a block diagram depicting an exemplary processor-based electronic device, generally designated by the reference numeral 10. The device 10 may be any of a variety of different types, such as a computer, pager, cellular telephone, personal organizer, etc. In a typical processor-based device, a processor 12, such as a microprocessor, executes software to control the operation of the device 10.

The device 10 typically includes a power supply 14. If the device 10 is portable, the power supply 14 may include permanent batteries, replaceable batteries, and/or rechargeable batteries. The power supply 14 may also include an AC adapter, so that the device may be powered from a wall outlet. The power supply 14 may also include a DC adapter, so that the device 10 may be plugged into a source of DC power such as the cigarette lighter receptacle in a vehicle.

Various other devices may be coupled to the processor 12, depending upon the functions that the device 10 performs. For instance, an input device 16 may be coupled to the processor 12. The input device 16 may include any type of device that allows a user to issue commands to the device 10. Examples of typical input devices include buttons, switches, a keyboard, a light pen, a mouse, and/or a voice recognition system. A display 18 may also be coupled to the processor 12. The display 18 may include an LCD display, a CRT, LEDs, and/or an audio display. A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory devices may be coupled to the processor 12 to store the programming and other data. For instance, the processor 12 may be coupled to volatile memory 26, which may include dynamic random access memory (DRAM), static random access memory (SRAM), etc. The processor 12 may also be coupled to non-volatile memory 28. The non-volatile memory 28 may include a read-only memory (ROM), such as an EPROM or flash memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

A system clock 30 may be connected to one or more of the components of the device 10. The connections between the system clock and other devices are not shown in FIG. 1 for purposes of clarity. Examples of components within the device 10 that may be connected to the system clock 30 include the processor 12, the non-volatile memory 28, and/or the volatile memory 26.

The processor 12, the non-volatile memory 28, and the volatile memory 26 may be implemented as one or more integrated circuit components. Also, the processor 12, the non-volatile memory 28, and the volatile memory 26 are examples of integrated circuit components that may include embodiments of capacitance or storage cells constructed according to the present invention.

Figure 2:
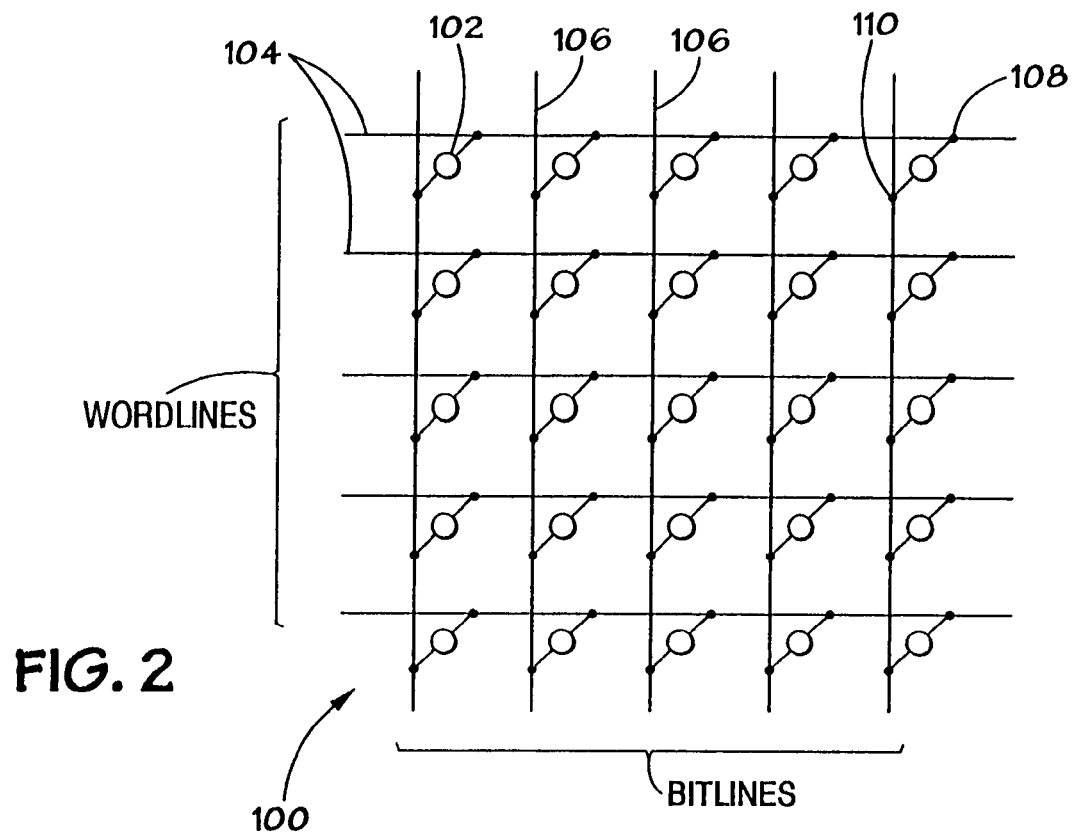
FIG. 2 illustrates a portion of a memory array.

FIG. 2 illustrates a portion of a memory array, which may be included in one or more of the integrated circuit devices illustrated as part of the electronic device 10 in FIG. 1. The memory array is referred to generally by the reference numeral 100. As can be seen, the memory array 100 includes a plurality of memory cells 102 that are arranged in generally perpendicular rows and columns. The memory cells 102 in each row are coupled together by a respective word line 104, and the memory cells 102 in each column are coupled together by a respective digit line or bit line 106. Specifically, each memory cell 102 includes a word line node 108 that is coupled to a respective word line 104, and each memory cell 102 includes a digit line node 110 that is coupled to a respective digit line 106. The conductive word lines 104 and digit lines 106 are collectively referred to as address lines. These address lines may be electrically coupled to an integrated circuit such as a processor or memory controller so that each of the memory cells 102 can be accessed for storage and retrieval of information.

Figure 3:
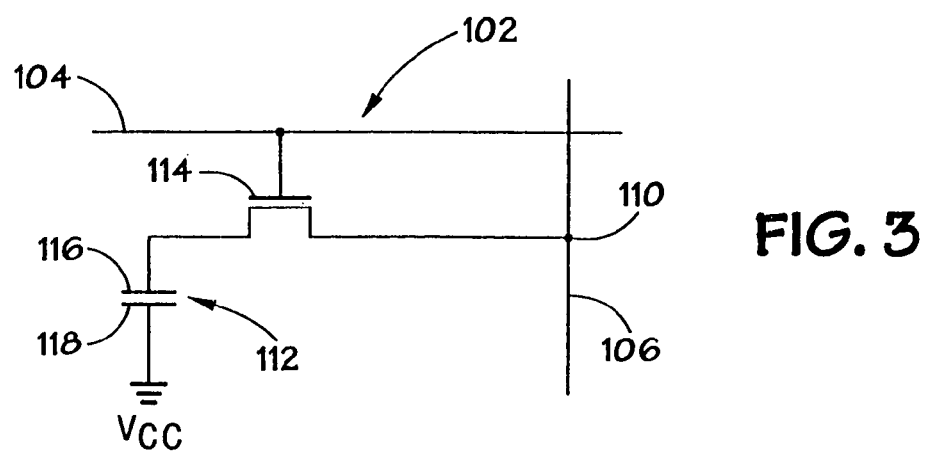
FIG. 3 illustrates an electric schematic diagram of an exemplary memory cell in the array of FIG. 2.

FIG. 3 illustrates an exemplary memory cell 102 that may be used in the memory array 100. The memory cell 102 includes a memory element 112 that may be coupled to an access device 114. The memory element 112 may be a capacitive memory element such as a storage capacitor, and the access device 114 may be a MOSFET transistor. Capacitors may be used as the storage element in dynamic random access memory ("DRAM") or other memory types. The gate of the transistor 114 may be coupled to the word line 104 to form the word line node 108, and the source of the transistor 114 may be coupled to the bit line 106 to form the bit line node 110. One plate 116 of the memory element 112 may be coupled to the drain of the transistor 114, and the other plate 118 of the memory element 112 may be coupled to a voltage level $V_{CC}$, which is typically circuit ground.

Figure 4:
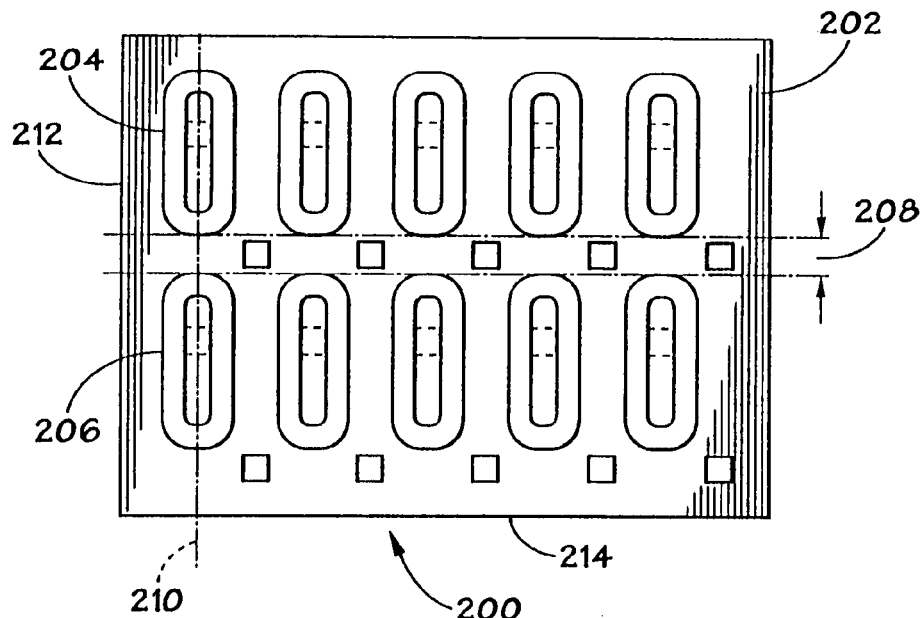
FIG. 4 is a diagram showing an orthogonal layout of a group of capacitive memory elements.

FIG. 4 is a diagram showing an orthogonal layout of a group of capacitive memory elements. The layout is generally referred to by the reference numeral 200. Each of the capacitive memory elements may be adapted to store a piece of digital data called a "bit." Each bit may correspond to a logical high, which may be referred to as a logical "1", or a logical low, which may be referred to as a logical "0". The capacitive memory elements shown in FIG. 4 are oriented on a substrate 202. A capacitive memory element 204 is part of a first row of capacitive memory elements on the substrate 202. A capacitive memory element 206 is part of a second row of capacitive memory elements on the substrate 202. For purposes of simplicity, the controlling element or transistor for the capacitive memory cells 204, 206 are not shown.

The capacitive memory elements on the substrate 202 are arranged in an orthogonal manner with respect to the substrate 202 and with respect to each other. An axis 210 that runs longitudinally through the center of the capacitive memory elements 204, 206 would be generally parallel with an edge 212 of the substrate 202 and generally perpendicular with an orthogonal edge 214 of the substrate 202. Another way to describe the orthogonal relationship of the capacitive memory elements disposed on the substrate 202 is that a single longitudinal axis, such as the longitudinal axis 210, may be drawn through a capacitive memory element on the first row (for example, the capacitive memory element 204) and a corresponding capacitive memory element on the second row (for example, the capacitive memory element 206). For example, the axis 210, which corresponds to the longitudinal axis of the capacitive memory element 204 would correspond with and pass through the longitudinal axis of the capacitive memory element 206.

Another aspect of the layout 200 is the distance between the row of capacitive memory elements that contains the capacitive memory element 204 (the first row) and the row of capacitive memory elements that contains the capacitive memory element 206 (the second row). A distance 208 separates the first row of capacitive memory elements from the second row of capacitive memory elements. The actual length of the distance 208 depends on a number of factors, but it is typically sufficiently large to prevent bridging between capacitive memory elements 204 in the first row and capacitive memory elements 206 in the second row. Bridging may occur if the capacitive memory elements in adjacent rows are sufficiently close to each other so that charge stored by one of the capacitive memory elements 204 in the first row leaks or bleeds over to a capacitive memory element 206 in the second row or vice versa. Such leakage or bleeding may result in corruption of the data stored in the capacitive memory elements As will be apparent to one of ordinary skill in the art, the distance 208 tends to limit the length of the capacitive memory elements 204, 206. Capacitive memory elements cannot be so long that they extend into the area between the two dashed lines corresponding to the distance 208 without the risk of undesirable bridging. Because capacitance of the capacitive memory elements 204, 206 is proportional to the size of the capacitive memory elements, the distance 208 imposes a design limitation on the capacitance of the capacitive memory elements 204, 206.

Figure 5:
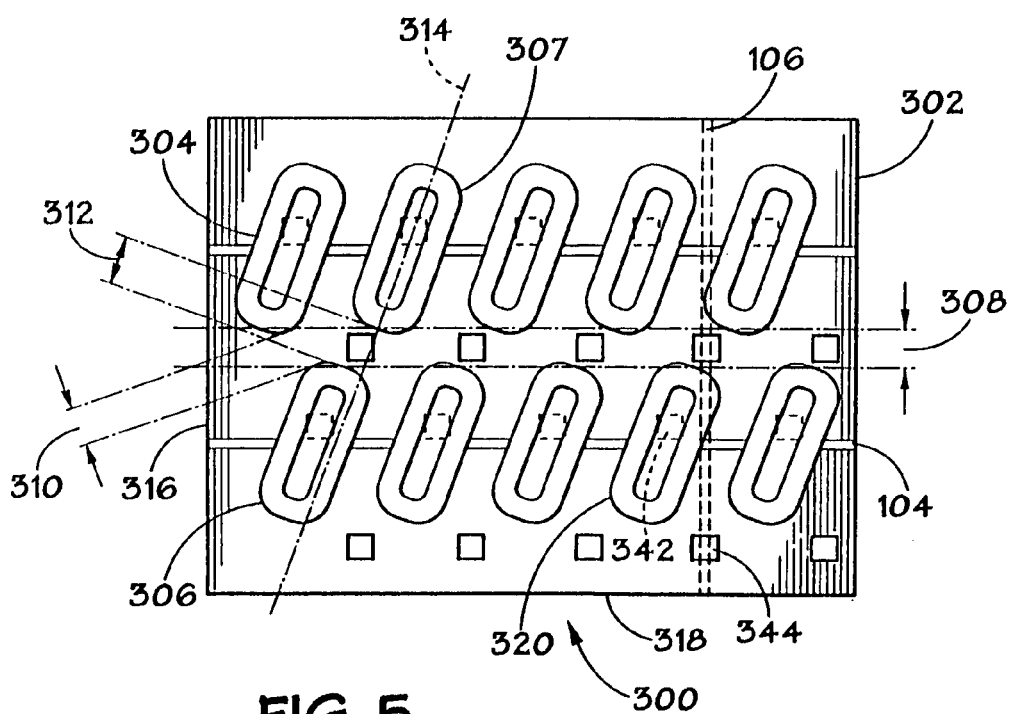
FIG. 5 is a diagram showing a slanted layout of a group of capacitive memory elements according to an exemplary embodiment of the present invention.

FIG. 5 is a diagram showing a slanted layout of a group of capacitive memory elements according to an exemplary embodiment of the present invention. The capacitive memory elements shown in FIG. 5 are disposed in a slanted or non-orthogonal orientation on a substrate 302 to facilitate larger capacitors while maintaining or increasing separation to avoid undesirable bridging. A capacitive memory element 304, which is illustrated as being generally ellipsoidal or oblong in this embodiment, is part of a first row of capacitive memory elements on the substrate 302. A capacitive memory element 307 is also part of the first row of capacitive memory elements on the substrate 302, and a capacitive memory element 306 is part of a second row of capacitive memory elements on the substrate 302.

In the slanted or non-orthogonal capacitive memory element orientation depicted in FIG. 5, an axis that runs longitudinally through any of the capacitive memory elements (such as an axis 314 that runs longitudinally through the capacitive memory cell 307) would not be generally parallel with an edge 316 of the substrate 302. Similarly, an axis that runs longitudinally through any of the capacitive memory elements on the substrate 302 (such as the longitudinal axis 314 through the capacitive memory cell 307) would not be generally perpendicular with an orthogonal edge 318 of the substrate 302.

Another way to describe the slanted or non-orthogonal relationship of the capacitive memory elements disposed on the substrate 302 is that no single longitudinal axis may be drawn through a capacitive memory element on the first row and a corresponding capacitive memory element on the second row. For example, a single axis such as the longitudinal axis 314 through the capacitive memory element 307 may not correspond with a longitudinal axis through any of the other capacitive memory elements on the substrate 302.

The angle or slant of the capacitive memory elements may be developed on a case by case basis depending on design factors, which may include the overall size and shape of the substrate 302, the desired size of the capacitive memory elements 304, 306 and 307, and the desired capacitance of the capacitive memory elements 304, 306 and 307. Another design criterion that may be required may be a minimum distance between capacitive memory elements to avoid undesirable bridging. The angle or slant of the capacitive memory elements on the substrate 302 may be limited because some angles or slants may be sufficiently large as to result in the violation of the minimum distance between capacitive memory elements on the same row. An angle of about 5 degrees may produce an increase in capacitance of about 5% for each memory cell. An angle of about 18 degrees may produce an increase in capacitance of approximately 17% for each memory cell.

The relationship between the capacitance and capacitor shape may be expressed as C=eps*A/d where eps is the dielectric constant of the capacitor material (a fixed value), d is the separation between the capacitor plates, (also fixed) and A is the area of the region of the capacitor. The area referred to is not the area of the ellipse per se but the circumference of the ellipse multiplied by the height of the capacitor. The circumference of the ellipse may be expressed mathematically as circumference is equal to $2\pi*sqrt[(a^2+b^2)/2]$ where a is the length of the minor axis of the ellipse and b is the length of the major axis of the ellipse.

The slanted or non-orthogonal layout of the capacitive memory elements in FIG. 5 allows each of the capacitive memory elements shown in FIG. 5, including the capacitive memory elements 304, 306, 307 to be longer than the capacitive memory elements shown in the orthogonal layout of FIG. 4. The overall capacitance of the capacitive memory elements 304, 306 and 307 may therefore be greater than the capacitance of the capacitive memory elements 204, 206 (FIG. 4). Accordingly, the capacitive memory elements 304, 306 may have an increased ability to store a charge corresponding to a bit of data relative to the capacitive memory elements 204, 206. The specific increase in capacitance between the memory elements 304, 306, 307 (FIG. 5) and the capacitive memory elements 204, 206 (FIG. 4) may be dependent on design criteria such as the difference in length between the capacitive elements 304, 306, 307 and the capacitive memory elements 204, 206.

Because of the orientation of the capacitive memory elements 304, 306 and 307, the first and second rows of capacitive memory elements in FIG. 5 may be closer to each other than a distance 308, which is the same as the distance 208 (FIG. 4), without risking undesirable bridging between capacitive memory elements. This is true because the orientation shown in FIG. 5 may preserve or increase the absolute distance between capacitive memory elements while allowing the rows of capacitive memory elements to be placed closer to each other. The geometry of the capacitive memory elements 304, 306 and 307 results in the capacitive memory element 306 being spaced apart from the capacitive memory element 304 by a distance 310. The capacitive memory element 306 is spaced apart from the capacitive memory element 307 by a distance 312. The distances 310 and 312 are both the same as or greater than the distance 308, so bridging is prevented, even though the distance between the first row of capacitive memory elements and second row of capacitive memory elements in FIG. 5 is smaller than the distance 308.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An electronic device, comprising:
   a processor adapted to executed instructions;
   a storage device adapted to store instructions to be executed by the processor;
   a user input device adapted to receive data for use by the processor from a user;
   a display device adapted to produce an image for viewing by a user based on instructions executed by the processor; and
   a memory device that receives information stored on the storage device, the memory device comprising:
      a substrate; and
      a plurality of capacitive memory elements disposed on the substrate so that an axis that runs longitudinally through one of the plurality of capacitive memory elements is not generally parallel with an edge of the substrate, each of the plurality of capacitive memory elements comprising an outer sidewall and an inner sidewall, wherein the inner sidewall defines a generally convex volume.

2. The electronic device set forth in claim 1 wherein the axis is not generally perpendicular with an orthogonal edge of the substrate.

3. The electronic device set forth in claim 1 wherein each of the plurality of capacitive memory elements is generally oblong in shape.

4. The electronic device set forth in claim 3, wherein each of the plurality of capacitive memory elements is generally elliptical.

5. The electronic device set forth in claim 1 wherein each of the plurality of capacitive memory elements is slanted with respect to the edge of the substrate.

6. An electronic device, comprising:
   a processor adapted to executed instructions;
   a storage device adapted to store instructions to be executed by the processor;
   a user input device adapted to receive data for use by the processor from a user;
   a display device adapted to produce an image for viewing by a user based on instructions executed by the processor; and
   a memory device that receives information stored on the storage device, the memory device comprising:

a plurality of capacitive memory elements arranged in a first row and a second row so that an axis through one of the plurality of capacitive memory elements located in the first row does not form an axis of any capacitive memory element in the second row.

7. The electronic device set forth in claim 6 wherein the plurality of capacitive memory elements is disposed on a substrate.

8. The electronic device set forth in claim 7 wherein the axis is not generally parallel with an edge of the substrate.

9. The electronic device set forth in claim 8 wherein the axis is not generally perpendicular with an orthogonal edge of the substrate.

10. The electronic device set forth in claim 6 wherein each of the plurality of capacitive memory elements is slanted with respect to the edge of the substrate.

11. The electronic device set forth in claim 6 wherein each of the plurality of capacitive memory elements is generally oblong in shape.

12. The electronic device set forth in claim 11, wherein each of the plurality of capacitive memory elements is generally elliptical.

13. The electronic device set forth in claim 6 wherein the axis is a longitudinal axis.

\* \* \* \* \*